United States Patent [19]

Moss

[11] Patent Number: 4,779,010
[45] Date of Patent: Oct. 18, 1988

[54] MONOSTABLE LOGIC GATE IN A PROGRAMMABLE LOGIC ARRAY

[75] Inventor: William E. Moss, Sunnyvale, Calif.

[73] Assignee: Advanced Micro Devices, Inc., Sunnyvale, Calif.

[21] Appl. No.: 891,514

[22] Filed: Jul. 29, 1986

[51] Int. Cl.$^4$ .......................................... H03K 3/355
[52] U.S. Cl. ..................... 307/273; 307/452; 307/469; 307/481; 307/582; 307/585; 307/594; 307/605
[58] Field of Search ............... 307/443, 448, 452–453, 307/465, 468, 469, 481, 579, 582, 584–585, 273, 594, 601, 605; 364/716

[56] References Cited

U.S. PATENT DOCUMENTS

| | | | |
|---|---|---|---|
| 3,862,440 | 1/1975 | Suzuki et al. | 307/452 X |
| 4,437,024 | 3/1984 | Wacyk | 307/594 X |
| 4,518,873 | 5/1985 | Suzuki et al. | 307/594 X |
| 4,570,083 | 2/1986 | Nakaizumi | 307/453 X |

FOREIGN PATENT DOCUMENTS 54-49039 4/1979 Japan.
60-136420 7/1985 Japan.

OTHER PUBLICATIONS

Hines, "Combined Single-Shot and Delay Circuit", IBM T.D.B., vol. 18, No. 2, Jul. 1967, pp. 184–185.
Chang, "Integrated FET Single-Shot", IBM T.D.B., vol. 16, No. 1, Jun. 1973, pp. 315–316.
Kazmi, "Design Prototypes Quickly with Programmable Arrays", 2328 Electronic Design, vol. 29, Feb. 19, 1981, No. 4, pp. 121–124.

*Primary Examiner*—Stanley D. Miller
*Assistant Examiner*—D. R. Hudspeth
*Attorney, Agent, or Firm*—Kenneth E. Leeds; Alan H. MacPherson; Paul J. Winters

[57] ABSTRACT

An AND gate (40) includes first and second input leads (42,43) and an output lead (44). The AND gate includes a first N channel MOS ("NMOS") transistor (58) which couples the output lead to ground in response to the signal (IN1) on the first input lead and a second NMOS transistor (60) which couples the output lead to ground in response to the signal (IN2) on the second input lead. A buffer (76) having a high output impedance is coupled to the output lead and tends to maintain the output lead in a constant state. When the signal on the first input lead goes high, the first NMOS transistor turns off and a PMOS transistor (64) turns on, thereby coupling the output lead to a high voltage source for a predetermined time period. If the second NMOS transistor is off, the resulting pulse causes the AND gate output signal (Vout) to go high. The high impedance buffer maintains the output lead in the high state.

21 Claims, 5 Drawing Sheets

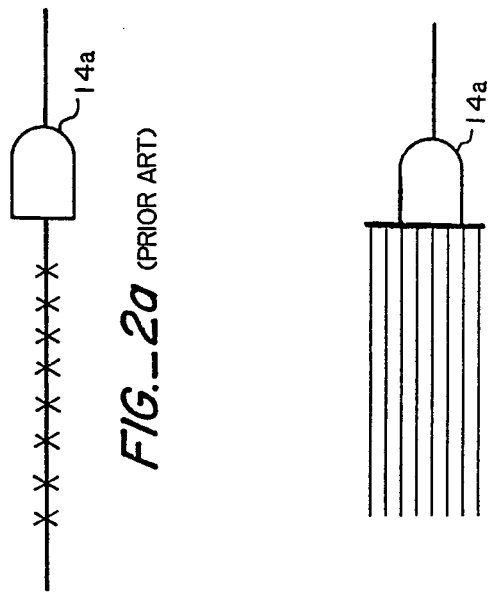
FIG._2a (PRIOR ART)
FIG._2b (PRIOR ART)
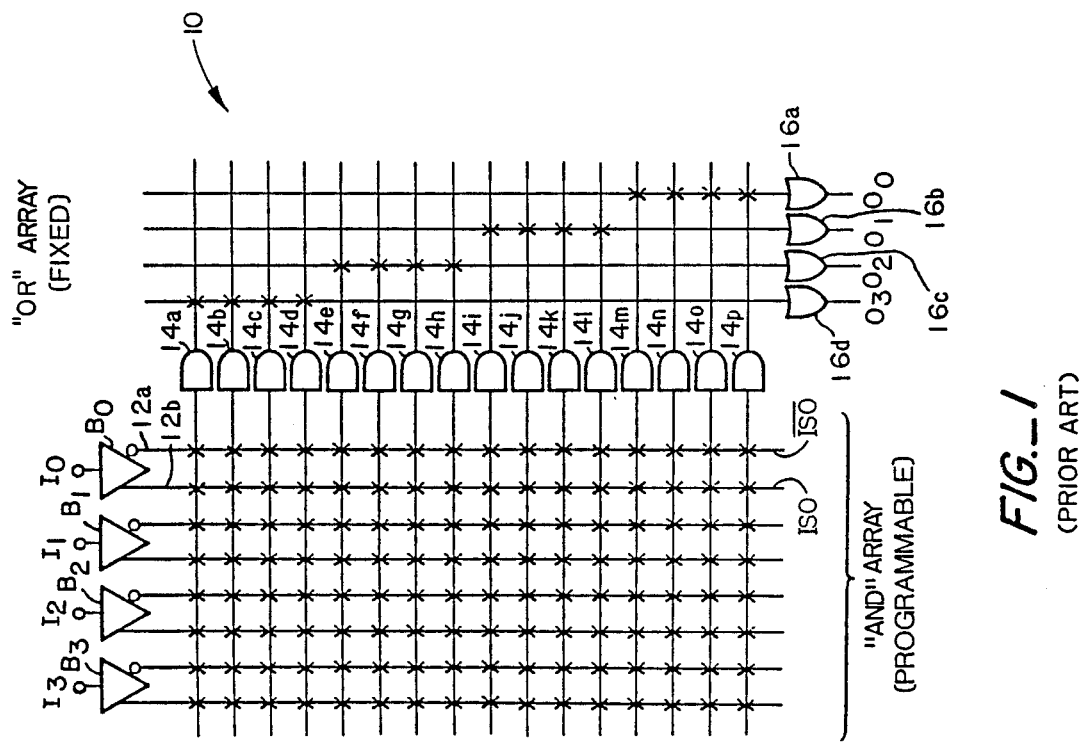
FIG._1 (PRIOR ART)

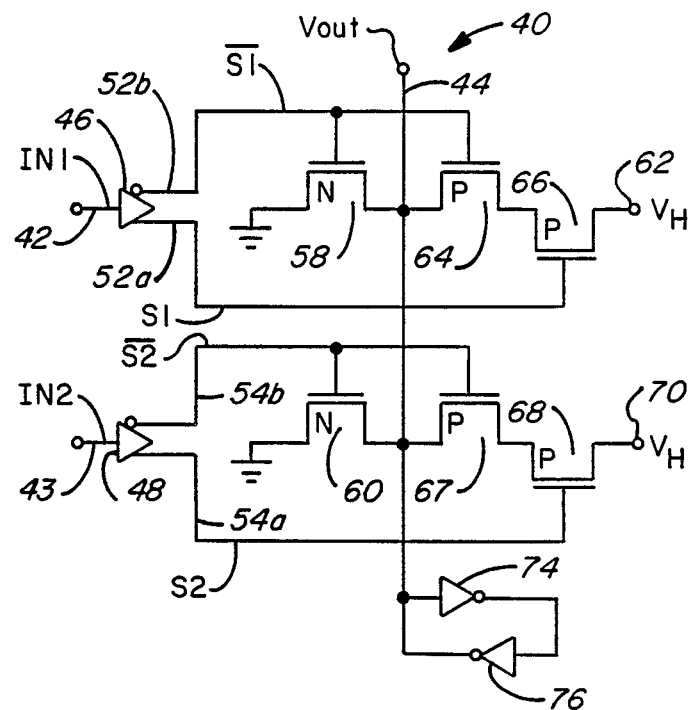
FIG._3
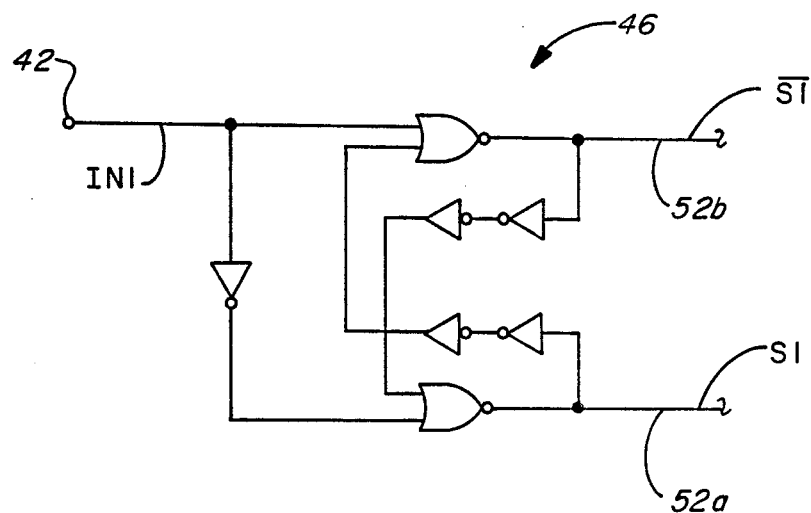
FIG._5

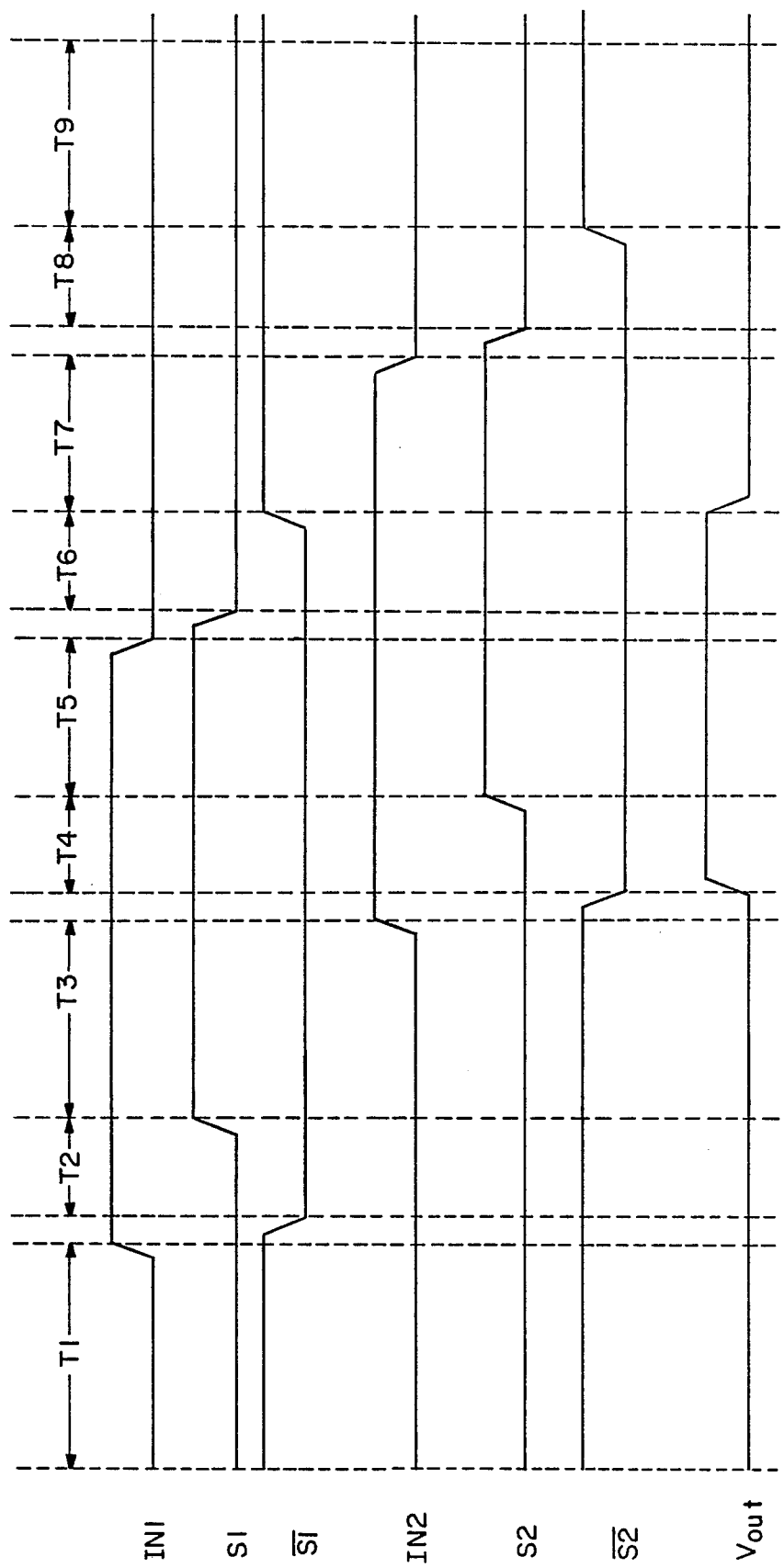
FIG._4

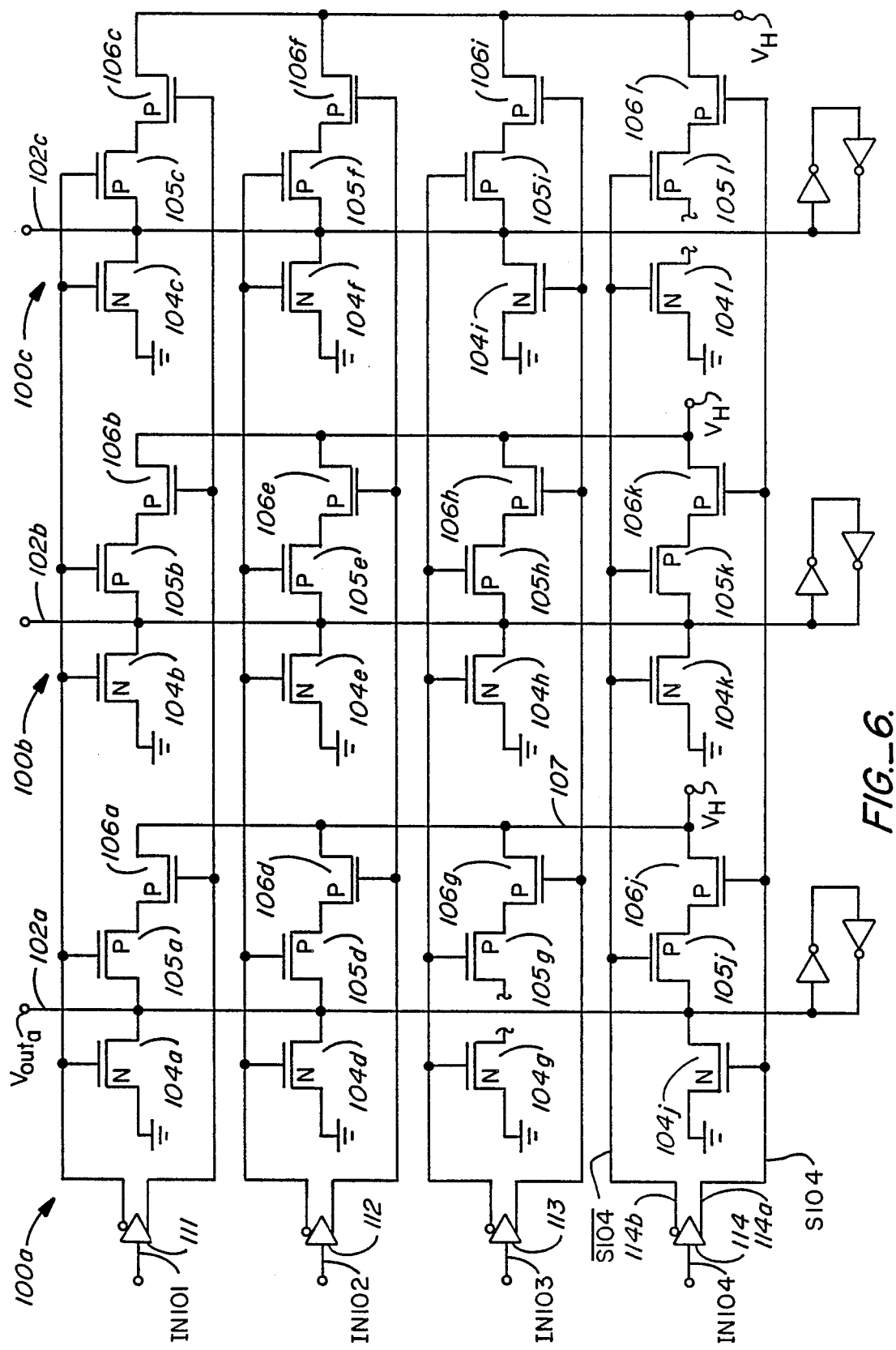
FIG._6.

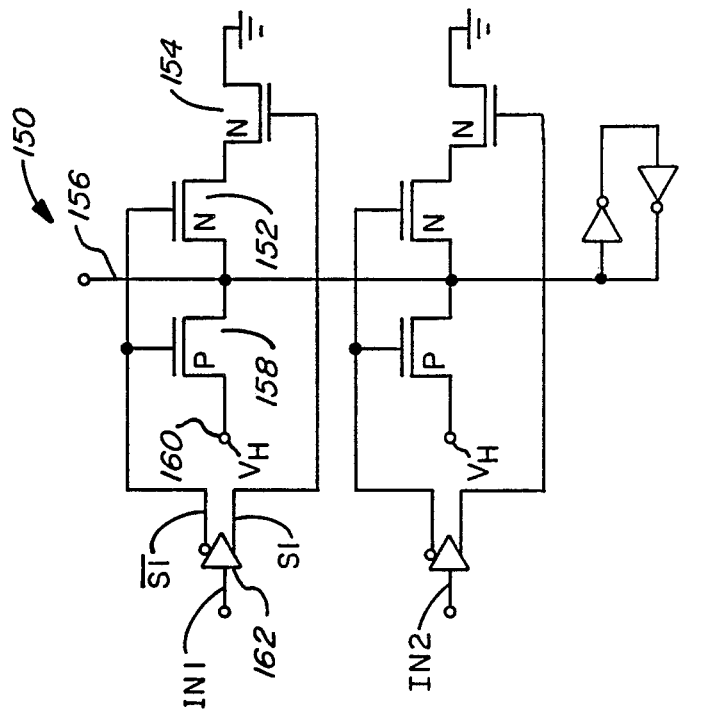
FIG._8
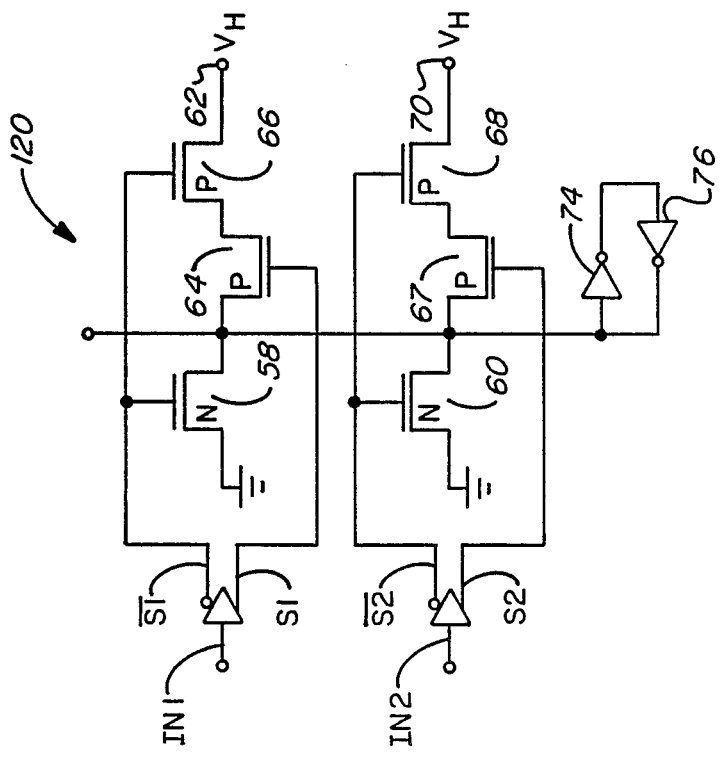
FIG._7

MONOSTABLE LOGIC GATE IN A PROGRAMMABLE LOGIC ARRAY

BACKGROUND OF THE INVENTION

This invention relates to the field of digital integrated circuits and more specifically to the field of programmable logic array (PLA) integrated circuits.

Programmable logic array circuits such as the circuits described in the "PAL Programmable Array Logic Handbook" published by Monolithic Memories, Inc., in 1983 are well known in the art. (PAL is a registered trademark of Monolithic Memories, Inc., the Assignee of this application.) FIG. 1 illustrates a simple PLA circuit 10. Included in circuit 10 are four input terminals $I_0$ through $I_3$, each of which is coupled to the input lead of a buffer B0 through B3, respectively. Each buffer has an inverting output lead and a noninverting output lead. For example, buffer B0 has an output lead 12a which provides a signal $\overline{ISO}$, which is the inverse of the signal present on terminal $I_0$. Similarly, buffer B0 has an output lead 12b, which provides a signal ISO, which is equal to the signal present at terminal $I_0$. Each of the output signals from buffers B0 and B3 is presented as an input signal to an AND gate 14a. AND gate 14a is an 8-input AND gate, and each of the output leads of buffers B0 to B3 is uniquely coupled to a single input lead of AND gate 14a. FIG. 2a illustrates the eight input leads to AND gate 14a. FIG. 2b illustrates AND gate 14a using the more conventional notation. In addition, fifteen other AND gates 14b to 14p are also connected to the output leads of buffers B0 through B3 in the same manner as AND gate 14a. Thus, each of AND gates 14a to 14p is coupled to all eight output leads of buffers B0 to B3. However, a purchaser of a PLA circuit has the option of severing the connection between a given buffer output lead and a given AND gate 14a to 14p. In some prior art circuits, this is done by opening a fuse similar to the fuses employed in programmable read only memories. In other prior art circuits this is done during the manufacturing process of the circuit. Regardless of how such connections are severed, the user can cause each AND gate 14a through 14p to provide a unique output signal dependent on a particular set of input signals. The output signals from AND gates 14a through 14p are sometimes referred to as the "product terms". (As used herein, the expression "product term" means the logical product resulting from a logical AND operation on a plurality of input signals, e.g., SIGNAL$_1$. SIGNAL$_2$, while the expression "sum term" means the logical sum, resulting from a logical OR operation performed on a plurality of input signals, e.g., SIGNAL$_1$+SIGNAL$_2$.)

Also, as can be seen in FIG. 1, a first OR gate 16a includes four input leads coupled to the output leads of AND gates 14m, 14n, 14o and 14p. OR gate 16a generates an output signal on an output lead $O_0$ therefrom. Similarly, an OR gate 16b receives output signals from AND gates 14i, 14j, 14k and 14l and generates an output signal on an output lead $O_1$ therefrom. In this way, programmable circuit 10 provides desired programmable Boolean functions which can be used in a variety of applications. As used in this specification, a programmable logic circuit which provides "desired programmable Boolean functions" is one which can be programmed by the system designer to provide any of a number of Boolean functions required in a given system design. This semicustom circuit provides an inexpensive replacement for a large number of integrated circuits which would otherwise be required.

It is known in the art to manufacture PLAs using bipolar or CMOS processes. One advantage of using CMOS technology is that the resulting PLA consumes less power than a bipolar PLA. In fact, it is desirable to have PLAs consume as little power as possible.

SUMMARY

A PLA constructed in accordance with the present invention includes an array of AND gates. Each AND gate within the array of AND gates includes an output lead for providing an output signal and a set of input leads for providing input signals. The output lead is connected to a high output impedance buffer which tends to maintain the output lead in a constant state. The AND gate also includes a first set of switches, each being connected between the output lead and ground. The switches are each associated with one of the input leads and close when the signal on the associated input lead goes low. The AND gate includes a second set of switches connected between the output lead and a voltage source. Each switch within the second set of switches is associated with one of the input leads. When the input signal on an input lead goes high, the associated switch within the second set of switches closes for a predetermined time period and then opens. When that happens, if none of the switches within the first set of switches is closed, the signal on the output lead goes high. If one or more of the switches within the first set of switches are closed, the signal on the output lead remains low. Of importance, the AND gate of the present invention consumes very little DC power. This is because normally, the second set of switches remains open, and thus there is no DC current flowing from the voltage source to ground. The switches within the second set of switches only close for a brief period of time (when an input signal changes state), thus limiting power consumption. The invention is better understood with reference to the drawings and detailed description below.

BRIEF DESCRIPTION OF THE DRAWINGS

FIG. 1 schematically illustrates a programmable logic array constructed in accordance with the prior art.

FIG. 2a illustrates an AND gate using the notation of FIG. 1.

FIG. 2b illustrates the AND gate using more conventional logic symbol notation.

FIG. 3 illustrates an AND gate constructed in accordance with the present invention.

FIG. 4 is a waveform diagram of various signals within the AND gate of FIG. 3.

FIG. 5 illustrates a circuit for providing pulses to the circuit of FIG. 3.

FIG. 6 illustrates an array of AND gates constructed in accordance with the present invention.

FIGS. 7 and 8 illustrate AND gates constructed in accordance with other embodiments of the invention.

DETAILED DESCRIPTION

FIG. 3 schematically illustrates an AND gate 40 constructed in accordance with the present invention. Referring to FIG. 3, AND gate 40 includes a first input lead 42 for receiving an input signal IN1, a second input lead 43 for receiving an input signal IN2 and an output lead 44 for providing an output signal Vout.

Signal IN1 is presented to a buffer 46 which provides a signal S1 equal to signal IN1 on an output lead 52a and a signal $\overline{S1}$ equal to the inverse of signal IN1 on an output lead 52b. Buffer 46 is designed so that when signal IN1 goes from a low level to a high level, signal S1 does not go high until a predetermined time period after signal $\overline{S1}$ goes low. Similarly, when signal IN1 goes from a high level to a low level, signal $\overline{S1}$ does not go high until a predetermined time period (in one embodiment 10 nanoseconds) after signal S1 goes low. The relationship between signals IN1, S1 and $\overline{S1}$ is illustrated in FIG. 4. The reason for this timing relationship is discussed below.

Signal IN2 is received by a buffer 48 which provides signals S2 and $\overline{S2}$ on output leads 54a and 54b, respectively. The timing relationship between signal IN2, S2 and $\overline{S2}$ is the same as that for IN1, S1 and $\overline{S1}$ described above. This timing relationship is also illustrated in FIG. 4. Input signals IN1 and IN2 of FIG. 4 are merely examples of input signal waveforms provided for illustrative purposes only. Other input signal waveforms can also be applied to AND gate 40.

Referring to FIG. 4, during a first time period T1, input signals IN1 and IN2 are both low, and therefore signals S1 and S2 are low and signals $\overline{S1}$ and $\overline{S2}$ are high. An N channel MOS ("NMOS") transistor 58 couples output lead 44 to ground when signals $\overline{S1}$ is high. Similarly, an NMOS transistor 60 couples output lead 44 to ground when signal $\overline{S2}$ is high. Therefore, when signal $\overline{S1}$ or signal $\overline{S2}$ is high, output signal Vout is low.

Of importance, a pair of P channel MOS ("PMOS") transistors 64 and 66 are coupled in series between output lead 44 and a terminal 62 which receives a voltage VH (typically about 5 volts). Because signal S1 is low during time period T1, PMOS transistor 66 is on. However, because signal $\overline{S1}$ is high, PMOS transistor 64 is off and output lead 44 is not connected to terminal 62. Similarly, PMOS transistors 67 and 68 are coupled in series between output lead 44 and a terminal 70 which receives voltage VH. Although during time period T1, PMOS transistor 68 is on (because signal S2 is low), PMOS transistor 67 is off (because signal $\overline{S2}$ is high). Therefore, output lead 44 is not connected to terminal 70 during time period T1.

At the end of time period T1, signal IN1 goes high and signal $\overline{S1}$ goes low almost immediately, thereby turning off NMOS transistor 58 and turning on PMOS transistor 64 (time period T2 of FIG. 4). As mentioned above, signal S1 does not go high until 10 nanoseconds after signal $\overline{S1}$ goes low. During this time, PMOS transistors 64 and 66 are both on, and output lead 44 is coupled to terminal 62. However, the series impedance of PMOS transistors 64 and 66 is greater than the impedance of NMOS transistor 60 and therefore output signal Vout remains low.

At the end of time period T2, signal S1 goes high, thereby turning off transistor 66. Therefore, during time period T3, output lead 44 is no longer connected to terminal 62 and transistor 58, 64 and 66 have no affect on output lead 44. However, output lead 44 remains connected to ground via NMOS transistor 60.

At the end of time period T3, input signal IN2 goes high, thereby causing signal $\overline{S2}$ to go low, turning off NMOS transistor 60 and turning on PMOS transistor 67. However, signal S2 does not go high until 10 nanoseconds after signal $\overline{S2}$ goes low. Therefore, during time period T4, signals S2 and $\overline{S2}$ are both low and PMOS transistors 67 and 68 are both on. Because of this, output lead 44 is coupled to terminal 70 and therefore charges to voltage VH.

It is noted that output lead 44 is connected to a first inverting buffer 74 which drives a second inverting buffer 76. Second inverting buffer 76 has a high output impedance and drives output lead 44, thereby tending to maintain output signal Vout constant. Because buffer 76 has a high output impedance, output lead 44 is pulled high when PMOS transistors 67 and 68 turn on, even though buffer 76 attempts drive output lead 44 with a low voltage when signal IN2 first goes high. Thus, PMOS transistors 66 and 67 override buffer 76. After signal Vout goes high, buffer 76 changes state and drives output lead 44 with a high voltage.

After time period T4, signal S2 goes high, thereby turning off PMOS transistor 68. At this time, transistors 60, 67 and 68 have no affect on output lead 44. However, because of inverting buffers 74 and 76, output lead 44 is maintained at a high voltage during time period T5.

At the end of time period T5, input signal IN1 goes low, which causes signal S1 to go low, thereby turning on PMOS transistor 64. Thus, during this time period, PMOS transistors 64 and 66 are both on. This has no effect on output lead 44, since signal Vout is already high. At the end of time period T6, signal $\overline{S1}$ goes high, thereby turning off PMOS transistor 64 and turning on NMOS transistor 58. At this time, output lead 44 is again coupled to ground via NMOS transistor 58 and output signal Vout goes low. It will be appreciated by those skilled in the art in light of the teachings of this invention, that output signal Vout on output lead 44 goes low even though inverting buffer 76 tries to drive output lead 44 with a high voltage because inverting buffer 76 has a high output impedance. Thus, NMOS transistor 58 overrides buffer 76. After signal Vout goes low, high output impedance buffer 76 changes state and drives output lead 44 with a low voltage.

At the end of time period T7, signal IN2 goes low, thereby causing signal S2 to go low, and turning on PMOS transistor 67. Thus, at the end of time period T7, output lead 44 is coupled to terminal 70 via PMOS transistors 67 and 68. However, since the impedance of series connected transistors 67 and 68 is greater than the impedance of transistor 58, signal Vout remains low.

At the end of time period T8, signal $\overline{S2}$ goes high, turning off PMOS transistor 67 and turning on NMOS transistor 60. At this time, output lead 44 is coupled to ground through transistor 60 as well as transistor 58, and voltage Vout remains low.

FIG. 5 schematically illustrates buffer 46, which ensures that signals S1 and $\overline{S1}$ have the appropriate timing relationship. Buffer 48 is identical to buffer 46.

It will be appreciated by those skilled in the art in light of the teachings of this invention, that the reason signal S1 goes high only a certain delay time after signal $\overline{S1}$ goes low is to ensure that during a brief time period (and only a brief time period), PMOS transistors 64 and 66 are both on. It is necessary to ensure that signal S2 goes high only a predetermined time after signal $\overline{S2}$ goes low for similar reasons.

In the embodiment of FIG. 3, it is not necessary to ensure that signal $\overline{S1}$ does not go high until a predetermined time period after signal $\overline{S1}$ goes low (time period T6). AND gate 40 would function if signal $\overline{S1}$ went low at the same time signal $\overline{S1}$ when high. However, as will be explained below, in other embodiments, this aspect of the timing relationship illustrated in FIG. 4 is necessary.

FIG. 6 schematically illustrates a set of three AND gates 100a to 100c. AND gates 100a to 100c can be part of a larger array of AND gates, such as the array of AND gates within a PLA. In such an embodiment, output leads 102a to 102c of AND gates 100a to 100c are connected to an OR gate (not shown).

AND gates 100a to 100c receive four input signals IN101 to IN104. It is seen that the electrical connection between output lead 102a of AND gate 100a and NMOS transistor 104g is severed. Similarly, the electrical connection between output lead 102a and PMOS transistor 105g is severed. In this way, signal $Vout_a$ on output lead 102a is independent of signal IN103. By severing the electrical connection between selected output leads and transistors, AND gates 100a to 100c can be programmed to provide desired Boolean functions. These electrical connections can be severed either during the manufacturing process (e.g. by not providing electrical connections in appropriate places) or after the manufacturing process (e.g. by opening a polycrystalline silicon fuse or by storing electrical charge on the floating gate of an appropriately connected floating gate transistor). These electrical connections can be severed in other ways as well. In some embodiments, instead of severing the connection between output lead 102a and transistor 104g, the electrical connection between the source of transistor 104g and ground is severed. Transistor 106g is disconnected from lead 107 in a similar manner.

It is noted that AND gate 100a includes an NMOS transistor 104j which has a gate coupled to noninverting output lead 114a of buffer 114 instead of inverting output lead 114b. The gate of each NMOS transistor 104a to 104l is programmably electrically connected to either the inverting output lead of an associated one of buffers 111 to 114, or is programmably electrically connected to the noninverting output lead of the associated buffer. Because NMOS transistor 104j is connected to noninverting output lead 114a, AND gate 100a provides $$Vout_a = IN101 \cdot IN102 \cdot \overline{IN104}$$

instead of $$Vout_a = IN101 \cdot IN102 \cdot IN104$$

In this way, each AND gate 100a to 100c can provide the logical product of input signals or the logical product of the inverse of input signals. The electrical connection between the gate of NMOS transistors 104a to 104j, and their associated buffers are formed during or after the manufacturing process, for example, using the techniques described above.

It will be appreciated by those skilled in the art that in the embodiment of FIG. 6 it is necessary to maintain the timing relationship between signals IN104, S104 and $\overline{S104}$ so that signal $\overline{S104}$ does not go high until a predetermined time after signal S014 goes low. Although a similar timing constraint is not critical in the AND gate of FIG. 3, this timing constraint is important in the AND gates of FIG. 6. This is because if signals IN101 and IN102 are both high, i.e. NMOS transistors 104a and 104d are off and PMOS transistors 106a and 106d are off, it is necessary to provide a pulse on output lead 102a when signal IN104 goes low. This pulse will only be provided if there is a time period when PMOS transistors 105j and 106j are both on, i.e. during the time period after signal S104 goes low but before signal $\overline{S104}$ goes high.

As indicated above, some transistors, such as transistor 104g, are disconnected from the corresponding output lead 102a. In one embodiment, the gates of these NMOS transistors are programmably electrically disconnected from their associated input buffer 111 to 114, thereby reducing the capacitive load on the output leads of buffers 111 to 114. In other embodiments, both the NMOS and PMOS transistors decoupled from their associated output leads have gates decoupled from their associated input buffer.

FIG. 7 illustrates an AND gate 120 constructed in accordance with another embodiment in which the gate of PMOS transistor 64 is coupled to receive signal S1 and the gate of transistor 66 is coupled to receive signal $\overline{S1}$. AND gate 120 functions in the same manner as AND gate 40 described above. AND gates such as AND gate 40 or 120 can be used in an array of AND gates, e.g. in a PLA.

FIG. 8 illustrates an OR gate 150 constructed in accordance with another embodiment of the present invention. OR gate 150 includes NMOS transistors 152 and 154 coupled in series between an output lead 156 and ground, and a PMOS transistor 158 coupled between output lead 150 and a terminal 160 for receiving voltage VH. In OR gate 150, buffer 162 provides signals $\overline{S1}$ and S1 such that signal $\overline{S1}$ does not go low until after a predetermined time delay after signal S1 goes high, and signal S1 does not go low until after a predetermined time delay after signal S1 goes high. Thus, the timing relationship of signals S1 and $\overline{S1}$ for OR gate 150 is the reverse of the timing relationship for AND gate 40 of FIG. 3.

As in the embodiment of FIG. 6, the gate of transistor 158 can be coupled to receive signal S1 instead of signal $\overline{S1}$ to generate the logical sum of $\overline{IN1}$ and IN2.

While specific embodiments of the present invention have been described, those skilled in the art will recognize that changes can be made in form and detail without departing from the spirit and scope of the invention. Accordingly, all such changes come within the present invention.

I claim:

1. A gate comprising:
    a first input lead for receiving a first input signal;
    a first voltage supply lead for receiving a first electrical potential;
    a second voltage supply lead for receiving a second electrical potential;
    an output lead for providing an output signal;
    first switch means coupled between said output lead and said first voltage supply lead;
    first control means coupled to said first input lead for controlling said first switch means so that said first switch means couples said output lead to said first voltage supply lead in response to said first input signal being at a first level;
    second switch means coupled between said output lead and said second voltage supply lead, said first control means causing said second switch means to close for a first time period and then open in response to said first input signal going from said first level to a second level; and
    high output impedance means having a high output impedance means input lead coupled to said output lead, and a high output impedance means output lead coupled to said output lead, said high output impedance means driving said high output impedance means output lead with a voltage approximately equal to the voltage at said high output impedance means input lead, said high output impedance means exhibiting an output impedance greater than the impedance exhibited by said first switch means when said first switch means is closed or the impedance exhibited by said second switch means when said second switch means is closed.

2. The gate of claim 1 further comprising:
a second input lead for receiving a second input signal;
third switch means coupled between said output lead to and said first voltage supply lead;
second control means coupled to said second input lead for causing said third switch means to couple said output lead to said first voltage supply lead in response to said second input signal being at said first level; and
fourth switch means coupled between said output lead and said second voltage supply lead, said second control means causing said fourth switch means to close for a second time period and then open in response to said second input signal going from said first level to said second level.

3. The gate of claim 2 wherein said first electrical potential is ground, and said first, second, third and fourth switch means comprise MOS transistors.

4. The gate of claim 2 wherein said first control means comprises:
a first control lead;
a second control lead;
means coupled to said first control lead, said second control lead and said first input lead for providing on said first control lead a first control signal equal to said first input signal and for providing on said second control lead a second control signal equal to the logical inverse of said first input signal, but wherein the signal on said first control lead is delayed by a time period relative to the signal on said second control lead when said first input signal goes from said first level to said second level, said second switch means being coupled to said first and second control leads and closing during said time period in response to said first and second control signals on said first and second control leads.

5. The gate of claim 4 wherein said second switch means comprises first and second PMOS transistors coupled in series between said output lead and said second voltage supply lead, the gate of said first PMOS transistor being coupled to said first control lead, the gate of said second PMOS transistor being coupled to said second control lead.

6. The gate of claim 5 wherein said first switch means comprises an NMOS transistor coupled between said output lead and said first voltage supply lead, the gate of said NMOS transistor being coupled to said second control lead.

7. The gate of claim 4 wherein said second switch means comprises first and second NMOS transistors coupled in series between said output lead and said second voltage supply lead, the gate of said first NMOS transistor being coupled to said first control lead, the gate of said second NMOS transistor being coupled to said second control lead.

8. The gate of claim 7 wherein said first switch means comprises a PMOS transistor coupled between said first voltage supply lead and said output lead, the gate of said PMOS transistor being coupled to said second control lead.

9. The gate of claim 1 further comprising:
a plurality of additional input leads, each input lead within said plurality of additional input leads receiving an associated input signal;
a first plurality of switch means, each switch means within said first plurality of switch means being uniquely associated with one of said input leads within said plurality of additional input leads;
second control means coupled to said first plurality of additional input leads for causing each switch means within said first plurality of switch means to couple said output lead to said first voltage supply lead in response to the input signal on said uniquely associated input lead being at said first level; and
a second plurality of switch means, each switch means within said plurality of switch means being uniquely associated with one of said input leads within said plurality of additional input leads, said second control means causing each switch means within said second plurality of switch means to couple said output lead to said second voltage supply lead for a time period and then open in response to the input signal on said uniquely associated input lead going from said first level to said second level.

10. A gate comprising:
a first input lead for receiving a first input signal;
an output lead for providing an output signal;
first switch means having a first lead coupled to receive a first electrical potential, said first switch means having a second lead programmably electrically coupled to said output lead;
first control means coupled to said first input lead for causing said first switch means to close in response to said first input signal being at a first level, said first switch means opening in response to said first input signal being at a second level; and
second switch means having a first lead coupled to receive a second electrical potential, said second switch means having a second lead programmably electrically coupled to said output lead, said first control means causing said second switch means to close for a predetermined time period and then open in response to said first input signal going from said first level to said second level.

11. A gate as in claim 10 further comprising:
a second input lead for receiving a second input signal;
third switch means having a first lead coupled to receive said first electrical potential, said third switch means having a second lead programmably electrically coupled to said output terminal;
second control means for causing said third switch means to close in response to said second input signal being at said first level, and for causing said third switch means to open in response to said second input signal being at said second level; and
fourth switch means having a first lead coupled to receive said second electrical potential, said fourth switch means having a second lead programmably electrically coupled to said output lead, said second control means causing said fourth switch means to close for a predetermined time period and then open in response to said second input signal going from said first level to said second level.

12. The gate of claim 11 wherein said first, second, third and fourth switch means comprise MOS transistors.

13. The gate of claim 11 further comprising a voltage supply lead for receiving said second electrical potential, said second switch means comprising a first MOS transistor and a second MOS transistor coupled in series between said output lead and said voltage supply lead, said first MOS transistor and said second MOS transistor both being closed when said first input signal goes from said first level to said second level.

14. A gate comprising:
a first input lead for receiving a first input signal;
an output lead for providing an output signal;
first switch means having a first lead coupled to receive a first electrical potential and a second lead coupled to said output lead, said first switch means being programmably electrically coupled to be in either a first mode or a second mode;
first control means for causing said first switch means to close in response to said first input signal being at a first level and to open in response to said first input signal being at a second level when said first switch means is in said first mode, said first control means causing said first switch means to close in response to said first input signal being at said second level and to open in response to said first input signal being at said first level when said first switch means is in said second mode; and
second switch means having a first lead coupled to receive a second electrical potential and a second lead coupled to said output lead, said first control means causing said second switch means to close for a predetermined time period and then open in response to said first input signal changing levels.

15. The gate of claim 14 further comprising:
a second input lead for receiving a second input signal;
third switch means having a first lead coupled to receive said first electrical potential and a second lead coupled to said output lead, said third switch means being programmably electrically coupled to be in either a first mode or a second mode;
second control means for causing said third switch means to close in response to said second input signal being at said first level and to open in response to said second input signal being at said second level when said third switch means is in said first mode, said second control means causing said third switch means to close in response to said second input signal being at said second level and to open in response to said second input signal being at said first level when said third switch means is in said second mode; and
fourth switch means having a first lead coupled to receive said second electrical potential and a second lead coupled to said output lead, said second control means causing said fourth switch means to close for a predetermined time period and then to open in response to said second input signal changing levels.

16. The gate of claim 14 wherein said second lead of said first switch means is programmably electrically coupled to said output lead and said second lead of said second switch means is programmably electrically coupled to said output lead.

17. The gate of claim 14 wherein said first control means comprises:
a third lead;
means for providing a first control signal equal to said first input signal on said third lead;
a fourth lead;
means for providing a second control signal equal to the logical inverse of said first input signal on said fourth lead;
and wherein said gate further comprises a voltage supply lead for receiving said first electrical potential, and wherein said first switch means comprises an MOS transistor coupled between said output lead and said voltage supply lead, the gate of said MOS transistor being programmably electrically coupled to said third lead when said first switch means is in said first mode, the gate of said MOS transistor being coupled to said fourth lead when said first switch means is in said second mode.

18. The gate of claim 14 wherein said first control means comprises:
a third lead;
means for providing a first control signal equal to said first input signal on said third lead;
a fourth lead;
means for providing a second control signal equal to the logical inverse of said first input signal on said fourth lead, and
wherein said gate further comprises a voltage supply lead for receiving said first electrical potential, and wherein said first switch means comprises an MOS transistor coupled between said output lead and said voltage supply lead, the gate of said MOS transistor being coupled to said fourth lead when said first switch means is in said first mode, the gate of said MOS transistor being coupled to said third lead when said first switch means is in said second mode.

19. The gate of claim 10 or 14 further comprising high output impedance means having a high output impedance means input lead coupled to said output lead, and a high output impedance means output lead coupled to said output lead, said high output impedance means driving said high output impedance means output lead with a voltage equal to the voltage at said high output impedance means input lead, said high output impedance means exhibiting an output impedance greater than the impedance exhibited by said first switch means when said first switch means is closed or the impedance exhibited by said second switch means when said second switch means is closed.

20. The gate of claim 1 or 10 wherein said first control means comprises input means for receiving said input signal and generating therefrom a second signal equal to said input signal and a third signal equal to the logical inverse of said input signal, said first switch means being responsive to said second signal, said second switch means being responsive to said second and third signals.

21. An array of gates comprising:
a plurality of input leads, each input lead receiving an associated input signal;
a plurality of output leads, each output lead providing an associated output signal;
a first voltage supply lead for receiving a first electrical potential;
a second voltage supply lead for receiving a second electrical potential;

a first array of switch means, each switch means within said first array comprising a plurality of rows of switch means, each row within said first array being associated with one of said input leads, each switch means within a given row being programmably coupled to be in either a first mode or a second mode, each switch means electrically connecting said first voltage supply lead to an associated one of said output leads in response to the signal at said associated input lead being at a first level when said switch means is in said first mode, and wherein when said switch means is in said second mode, said switch means does not connect said associated output lead to said first voltage supply lead; and a second array of switch means comprising a plurality of rows of switch means, each row of switch means within said second array being associated with one of said input leads, each switch means within a given row of switch means within said second array being connected between its associated output lead and said second voltage supply lead, each switch means within said second plurality of switch means being programmably electrically coupled to be in either a third mode or a fourth mode, each switch means within said second array closing and then opening when the signal on its associated input lead goes from said first level to a second level when said switch means within said second array is in said third mode, and wherein when said switch means in said second array is in said fourth mode, said switch means in said second array does not connect said associated output lead to said second voltage supply lead.

* * * * *